(12) United States Patent
Davis et al.

(10) Patent No.: US 8,154,306 B2
(45) Date of Patent: Apr. 10, 2012

(54) METHOD FOR SELECTING PROTECTIVE RESISTOR VALUE FOR A CAPACITOR CHARGING CIRCUIT WHICH ENABLES MAXIMUM ENERGY TRANSFER WITH MINIMAL HEAT

(76) Inventors: John Michael Davis, Sherman Oaks, CA (US); Lawrence Albert Leske, San Carlos, CA (US)

( * ) Notice: Subject to any disclaimer, the term of this patent is extended or adjusted under 35 U.S.C. 154(b) by 371 days.

(21) Appl. No.: 12/590,936

(22) Filed: Nov. 17, 2009

(65) Prior Publication Data
US 2011/0115496 A1 May 19, 2011

(51) Int. Cl.
*G01R 31/02* (2006.01)
(52) U.S. Cl. .......................... 324/549; 324/525
(58) Field of Classification Search ............... None
See application file for complete search history.

(56) References Cited

U.S. PATENT DOCUMENTS 7,408,755 B1 * 8/2008 Ye et al. .................... 361/93.1

* cited by examiner

*Primary Examiner* — Minh N Tang
(74) *Attorney, Agent, or Firm* — George S. Cole

(57) ABSTRACT

Electronic devices operate in an analog world and their circuitry is subject to non-linear environmental effects that can cause operational problems. Selecting components for a design for a capacitor-charging circuit that incorporates a current-limiting resistor and uses non-linear power supplies, either means having to test every possible combination of elements, and suffering a resultant 'combinatorial explosion' as complexity increases, or choosing to over-engineer against untested surprise failure points. Doing the latter in a cost-efficient manner through a min/max/log-set testing series also enables use of non-linear power supplies whose parameters are not known due to competitive or trade secret protective efforts by their manufacturers.

7 Claims, 2 Drawing Sheets

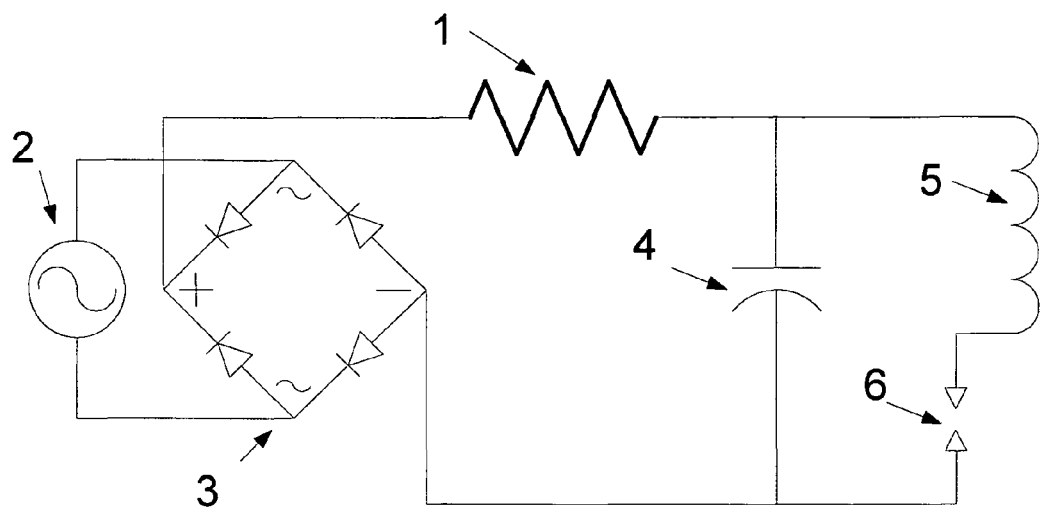
Figure 1A
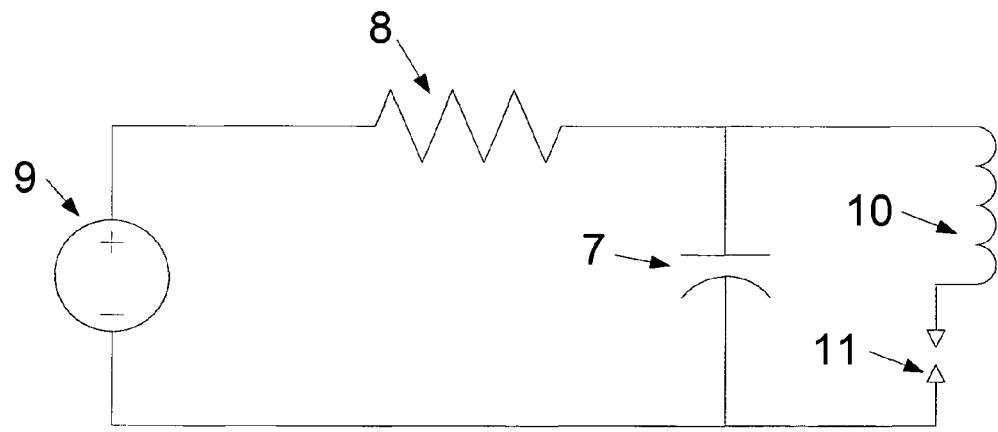
Figure 1B
FIGURE 1

METHOD FOR SELECTING PROTECTIVE RESISTOR VALUE FOR A CAPACITOR CHARGING CIRCUIT WHICH ENABLES MAXIMUM ENERGY TRANSFER WITH MINIMAL HEAT

BACKGROUND OF THE INVENTION

A capacitor-charging circuit utilizing non-linear power supplies often requires a current-limiting resistor which can not be estimated by the solution of simple linear-circuit equations. Consequently, a process is required to determine the appropriate value of the current-limiting resistor which is both sufficient to limit the current to protect all heat-sensitive or current-sensitive components, and also not too stringent so as to maximize power transfer efficiency, thus also lowering cooling requirements for the final circuit.

Power supplies for charging capacitors generally have a means of limiting periodic inrush current to prevent component failures. While there are many options for this, such as inductors, transistors, or varying supply voltages, the cheapest is often a resistor. The selection of the resistor for a linear power supply is simple: one solves the linear circuit equations for the greatest efficiency, or chooses the value providing sufficient current limiting to protect all components, or a cost-efficient combination of these constraints. However, if the supply is non-linear, such as those designed for constant-current, high-voltage outputs, in general the problem can not be solved unless all of the supply circuits' parameters are known. These are often not known due to normal practice of keeping the internal circuits a competitive secret.

DESCRIPTION OF THE DRAWINGS

FIG. 1 is comprised of two sub-drawings, FIG. 1A and FIG. 1B, described below.

FIG. 1A is a drawing of a capacitor-charging circuit that uses non-linear AC power supply source (2) with a rectifier circuit (3), showing the limiting resistor (1) placed in series between the source (2) and the capacitor to be charged (4); the circuit's load—such as that of a pulsed electromagnetic field device—is symbolized by the inductor (5), and spark gaps (6), which will discharge the capacitors when the capacitor charge is sufficient.

FIG. 1B is a drawing of the same capacitor-charging circuit that uses a non-linear direct power supply with an internal bridge rectifier (9); again the limiting resistor (8) is placed in series between the source (9) and the capacitor to be charged (7); and again the circuit's load is symbolized by the inductor (10), and the spark gaps (11). In this case the protective resistor (8) also functions to protect the circuit elements when the inductor (10) is generating a reverse voltage at the end of its discharge cycle.

SUMMARY OF THE INVENTION

Figure 2:
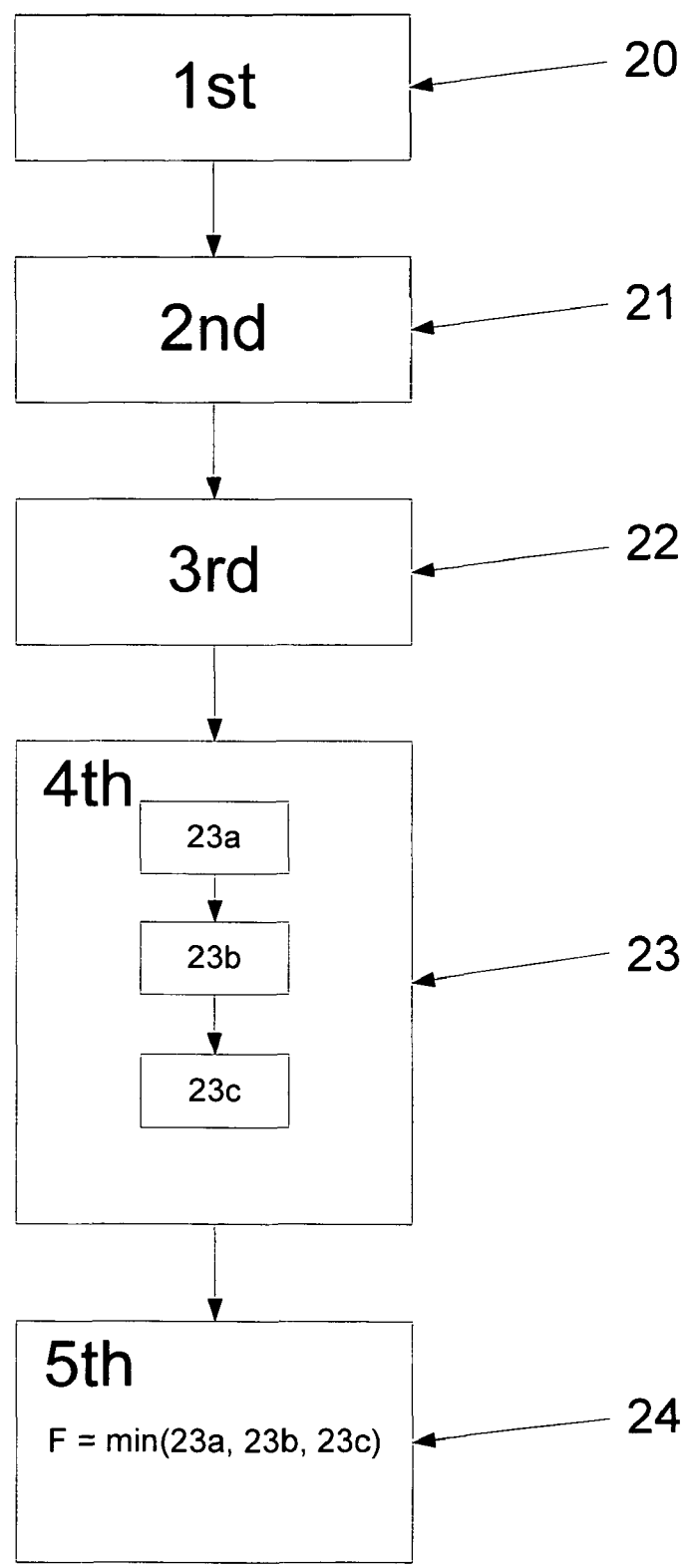
FIG. 2 is a drawing of the steps of the method in their sequence of operation. First is setting the minimum necessary resistance value (20); second is determining the greatest allowable resistance value (21). Together these establish the lower and upper bounds of the interval from which the necessary common power resistor values must be drawn. Third is selecting for each of the lower and upper bounds the specific common power resistor providing a resistance value closest to but within the boundaries of that interval, and inserting into that interval at least three approximately logarithmically chosen, common power resistor values for temperature testing (22). Having selected the lower bound, intermediate, and upper bound resistor values to be tested, then for each a test run is made. In each test run a common power resistor providing a resistance value closest to the value being tested is selected and inserted into the capacitor-charging circuit and the power is turned on (23a); then let run until the common power resistor's temperature stops rising (23b); and the result is recorded (23c). This test cycle is repeated for each of the resistor values to be tested (23). Finally, from the record of temperatures, comes the step of selecting the common power resistor with the lowest recorded stable temperature (24).

To avoid having to engage in testing all possible resistors which may be used as the means for limiting periodic inrush current to prevent component failures in a capacitor-charging circuit utilizing a non-linear power supply, and to maximize power transfer efficiency and limit cooling needs by selecting the least-strength resistor for the circuit, one determines the value of the desired protective resistance, and thus the choice of resistor, as follows.

First, determining a minimal-power resistance value which will ensure that no other component in said capacitor-charging circuit will be jeopardized by excess current, and setting that as the 'min' or base test value;

Second, determining the greatest-power resistance value which still allows the capacitor to charge within the time allowed, and setting that as the 'max' or highest test value;

Third, respectively selecting for the 'min' and 'max' test values the closest common power resistor having that resistance, and inserting into the interval between the base test value and the highest test value 3 or more approximately logarithmically chosen, common power resistor values for temperature testing, whereby if the logarithmically-chosen value is not a common power resistor value, the nearest common power resistor value is instead substituted;

Fourth, for each chosen, common power resistor value:
 a) inserting a resistor with that resistor value into said capacitor-charging circuit and turning on the power;
 b) letting the power run until the resistor's temperature stops rising; and,
 c) recording that stable temperature;

Finally, selecting the common power resistor with the lowest recorded stable temperature.

DETAILED DESCRIPTION OF THE INVENTION

There are two general means of providing high voltage to charge a capacitor. Either one uses an alternating current (AC) source (FIG. 1A, 2) with a rectifier circuit (FIG. 1A, 3), or a direct current power supply, which usually has an internal rectifier circuit such as a bridge rectifier (FIG. 1B, 9), as the direct source. In the simplest means a protective limiting resistor (FIG. 1A, 1; FIG. 1B, 8) is placed in series between the source (FIG. 1A, 2; FIG. 1B, 9) and the capacitor (FIG. 1A, 4; FIG. 1B, 7). In the example systems, the inductors (FIG. 1A, 5; FIG. 1B, 10) represent a load such as that of a pulsed electromagnetic field device, and the spark gaps (FIG. 1A, 6; FIG. 1B, 11) discharge the capacitors through the field coil inductors (FIG. 1A, 5; FIG. 1B, 10) when the capacitor charge is sufficient. In this case the protective resistors also function to protect the circuit elements when the inductor is generating a reverse voltage at the end of its discharge cycle.

Determine the most cost-effective value of the protective resistance, and thus of the common resistor to be used (FIG. 1A, 1; FIG. 1B, 8) by the following process.

First, determine the outer bounds, maximum and minimum, of resistance that will let this circuit function as desires. Start, as is ordinarily done for each component during a standard design procedure for any circuit, not specific to this process, by determining the minimal resistance which will ensure that no other component will be jeopardized by heat or current. Use that value as the first test value; any resistor providing less resistance than that will be useless to this circuit. Then determine the greatest value of resistance which would still allow the capacitor to charge within the maximal time allowed. Any resistor providing more resistance than that will be useless to this circuit. Use that value as the last test value. Note that if the power source were linear, this last value would minimize power loss; but this proves not to be the case with non linear sources.

Insert into the interval between the first and last values for protective series resistance at least 3, approximately logarithmically chosen, common power resistor values for temperature testing. In the example shown in Table 1 below as System 1, 500 Ohms was the first value, with 25000 Ohms as the last value. 6 intermediate resistances were chosen for testing, with 1000 Ohms the second, and 10000 Ohms the second-to-last, values. Each value was picked as being the common power resistor value that was closest to that calculable for the ordinal measure for the logarithmic separation between the first and last values. (I. e. the 'sixth' value was 3,500.)

The resistance rating for a resistor, the 'resistor value' for that resistor, and the resistance provided by that resistor, are herein considered to be the same, i.e. a resistor rated at 300 Ohms is a resistor with a resistance value of 300 Ohms, and that resistor provides 300 Ohms of resistance in a circuit. A common power resistor is one commercially available in mass production qualities at resistance values used in many established electronic circuit designs and markets. And practitioners with experience in the field commonly know what 'approximately logarithmically chosen' describes in the selection of electronic components as part of electronic circuit design.

As there were 8 values total to be tested, ranging from 500 Ohms to 25,000 Ohms, and as the resistors were more commonly available in 500-Ohm increments at the lower end of this interval, instead of selecting equal-interval values (which would have gone up by jumps of 3,500 Ohms per interval), an approximately logarithmic scale where the first, and third-through-fifth, test values went up by 500 Ohms, while the second, sixth, and seventh test intervals stretched to the nearest commonly available resistor in a more logarithmic scaling across the total interval.

For each resistance value, or resistor, selected, place it in the circuit then turn on the system and let it run until the resistor's temperature stops rising; and note its temperature. This may take 5 to 30 minutes or more for typical systems. Normally, one will choose the resistance for the protective resistor with the lowest operating temperature.

In the example shown in Table 1 below as System 1 the protective resistor with the lowers operating temperature is 2,000 Ohms, with a temperature of 92 degrees. In this example there are actually two minimums, if the error of temperature measurement is >1° F. The first at 2,000 Ohms, and the second at 1,000 Ohms. This non-obvious result is not unusual with non-linear power supplies. It is one of the reasons which prompted the development of this methodology. In such a case it may be useful to re-run the test for the two resistors but this time to also measure the temperature of the most heat-sensitive components, i.e. the ones whose lifetimes are most affected by heat (such as the diode rectifiers), and chose whichever of the 2 lowest protective resistors whose resistance values produce the lower temperature for those most sensitive components.

As can be seen in Table 1, System 1, where what was originally thought to be an optimal value of 25,000 Ohms based on linear systems analysis of the resistors and power source, using that strong a resistor produced temperatures over 2.5 times the process-selected optimal value of 2,000 Ohms. This justified the many hours of testing by lowering the cooling requirements for the circuit as a whole, which then enabled the use of only one fan (as opposed to two fans originally needed with the 25000 Ohm resistor). Similar results are seen in System 2 test, in which the process-selected resistance produced a resistor whose heat generation was less than one half the temperature of the highest selected value.

TABLE 1

| System 1 | | | | | | | | |
|---|---|---|---|---|---|---|---|---|
| Protective Resistor Ohms | 500 | 1000 | 2000 | 2500 | 3000 | 3500 | 10000 | 25000 |
| Temperature Fahrenheit | 111 | 93 | 92 | 98 | 95 | 101 | 151 | 240 |

| System 2 | | | | | | | |
|---|---|---|---|---|---|---|---|
| Protective Resistor Ohms | 380 | 500 | 1000 | 2000 | 3000 | 5000 | 12000 |
| Temperature Fahrenheit | 90 | 85 | 86 | 94 | 101 | 119 | 175 |

In the example for System 2, the lowest temperature (85 degrees) occurs with the 500 Ohm protective resistor. Again, while this is an obvious choice for power efficiency, since it develops the least heat with adequate protection, it may be useful to again check the most heat sensitive components to see if there is a useful temperature difference between it and the results of using the 1000 Ohm protective resistor which is only 1 degree hotter. If the capacitor, for example (as it is the most heat-sensitive circuit element), were cooler with the 1000 Ohm resistor, then that would be the appropriate choice.

When a result set such as System 2 occurs, where more than one common power resistors' recorded stable temperatures are substantially similar and notably below the temperatures of the remaining choices, then the method can be altered as follows. After selecting each of the common power resistors that provided one of the 2 lowest recorded temperatures, a second round of tests are run, repeating the first through fourth steps but recording also the temperature for the most heat-sensitive component of the capacitor-charging circuit, and, upon comparison of all the results, selecting the common power resistor with the lowest recorded stable temperature for that most heat-sensitive component.

In some cases it is useful to check more than one of the heat- or current-sensitive components, and to rate the value of each of them versus the effect of temperature or current on their reliability or useful lifetime, and selecting that resistor providing the greatest protection against such damage. Such ratings may be modified by the cost of component or cost of failure, or a combination of each. For example, using a cost rating, simply multiply the cost of each component by the rise in temperature of each component. The higher values can then be used to determine which value of protective resistance provides the greatest component cost protection; i.e. using a cost rating derived by simply multiplying the cost of each component by the rise in temperature of each component, and then using the highest resultant to determine which value of protective resistance provides the greatest component cost protection. This will result in the tester using as a rating multiplier the expected lifetime at each of the components' temperatures, particularly when a component has an exponentially-related failure rate with regard to temperature, and using the highest resultant to determine which value of protective resistance provides the greatest component failure-prevention cost protection.

Alternately, the expected lifetime at each of the components' temperatures may be used as a rating multiplier. This is especially useful for parts, such as electrolytic capacitors, which have an exponentially-related failure rate with regard to temperature. It is not uncommon for an 18 degree Fahrenheit rise in temperature to halve the expected lifetime of some components. While other components have only a nearly linear reduction in lifetime over rising temperatures or currents, and others none at all until a high failure temperature is encountered (often the case for resistors).

While doing these tests, check that the background temperature does not vary more than a degree to ensure the room temperature does not affect the individual resistance test results. For small changes in temperature, less than 10 degrees, a correction to the test results should be added corresponding to the change in temperature. That is, if the first test was done at a room temperature of 75 degrees, while the remainder were all at 78 degrees, add the difference to the first, or subtract the difference (3 degrees) from the others. The ambient temperature should therefore be checked for each resistance test with adjustments up or down, noted and made for each test.

It will be understood that the embodiments described herein are merely exemplary and that a person skilled in the art may make many variations and modifications without departing from the sphere and scope of the invention. All such variations and modifications are intended to be included in the scope of the invention as defined in the appended claims.

The claims stated herein should be read as including those steps and/or elements which are not necessary to the invention yet are in the prior art and are necessary to the overall function of that particular claim, and should be read as including, to the maximum extent permissible by law, known functional equivalents to the steps and/or elements disclosed in the specification, even though those functional equivalents are not exhaustively detailed herein. Accordingly, it is intended that the appended claims are interpreted as covering all alterations and modifications as fall within the true spirit and scope of the invention in light of the prior art.

Additionally, although claims have been formulated in this application to particular combinations, it should be understood that the scope of the disclosure of the present application also includes any single novel aspect or any novel combination of aspects disclosed herein, either explicitly or implicitly, whether or not it relates to the same invention as presently claimed in any claim and whether or not it mitigates any or all of the same technical problems as does the present invention. The applicant hereby give notice that new claims may be formulated to such features and/or combinations of such features during the prosecution of the present application or of any further application derived therefrom.

We claim:

1. A method to determine the optimal resistance value of a current-limiting resistor, which optimal resistance value is both sufficient to limit periodic inrush current to prevent component failures in a capacitor-charging circuit utilizing a non-linear power supply and to protect all heat-sensitive or current-sensitive components, yet also not too resistive so as to least degrade power transfer efficiency and thus also lower cooling requirements for the said capacitor-charging circuit, said method comprising:

First, determining a minimal resistance value which will ensure that no other component in said capacitor-charging circuit will be jeopardized by excess current, and setting that as the 'min' or base test value;

Second, determining the greatest resistance value which still allows the capacitor to charge within the time allowed, and setting that as the 'max' or highest test value;

Third, after respectively selecting for the 'min' and 'max' test values the closest common power resistor having that resistance, inserting into the interval between the base test value and the highest test value 3 or more approximately logarithmically-chosen, common power resistor values for temperature testing, whereby if the logarithmically-chosen value is not a common power resistor value, the nearest common power resistor value is instead substituted;

Fourth, for each chosen, common power resistor value:
  a) inserting a resistor with that resistor value into said capacitor-charging circuit and turning on the power;
  b) letting the power run until the resistor's temperature stops rising; and,
  c) recording that stable temperature;

Finally, selecting the common power resistor with the lowest recorded stable temperature.

2. A method as in claim 1 further comprising, if more than one common power resistors' recorded stable temperatures are substantially similar and notably below the temperatures of the remaining choices:

selecting as a first resistor the common power resistor with the lowest recorded stable temperature;

selecting as a second resistor the common power resistor with the next-lowest recorded stable temperature; and, repeating the first through fourth steps with each of the first and second resistors while also recording the temperature for the most heat-sensitive component of the capacitor-charging circuit; and, selecting whichever of the first and second resistors that had the lowest recorded stable temperature for that most heat-sensitive component.

3. A method as in claim 1 further comprising:

checking more than one of the heat- or current-sensitive components and rating their relative value versus the probability of damaging effect of temperature or current on their reliability or useful lifetime, and selecting that common power resistor providing the greatest protection against such damage.

4. A method as in claim 3 further comprising modifying the rating by any of the cost of each specific heat- or current-sensitive component, the cost of failure of each specific heat- or current-sensitive component, and a combination of any of those and the probability of damaging effect of temperature or current on their reliability or useful lifetime, before selecting that common power resistor providing the greatest protection against damage to and failure of the circuit.

5. A method as in claim 3 further comprising using a cost rating derived by simply multiplying the cost of each component by the rise in temperature of each component, and then using the highest resultant to determine which value of protective resistance provides the greatest component cost protection.

6. A method as in claim 3 further comprising using as a rating multiplier the expected lifetime at each of the components' temperatures, particularly when a component has an exponentially-related failure rate with regard to temperature rise, and using the highest resultant to determine which value of protective resistance provides the greatest component failure-prevention cost protection.

7. A method as in claim 1, further comprising any of the set of following steps to accommodate environmental testing influences:

checking that the background temperature does not vary more than a degree to ensure the room temperature does not affect the individual resistance test results;

using as a corrective to those test results wherein a small change of less than 10 degrees Fahrenheit in the background temperature occurred between tests, a corrective factor corresponding to the small change in the background temperature from the other test results; and, adding to the recorded temperatures the difference when the background temperature rose, and subtracting from the recorded temperatures the difference when the background temperature fell, the corrective factor for those tests where the background temperature had not changed.

* * * * *